(12) United States Patent
Bosvieux et al.

(10) Patent No.: US 10,116,287 B2
(45) Date of Patent: Oct. 30, 2018

(54) SWITCHED CURRENT CONTROL MODULE AND METHOD THEREFOR

(71) Applicant: NXP USA, Inc., Austin, TX (US)

(72) Inventors: Tristan Bosvieux, Toulouse (FR); Jeremy Guillermand, Toulouse (FR); John Pigott, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/409,024

(22) Filed: Jan. 18, 2017

(65) Prior Publication Data
US 2017/0366171 A1 Dec. 21, 2017

(30) Foreign Application Priority Data

Jun. 20, 2016 (EP) .................................... 16305746

(51) Int. Cl.
| | |
|---|---|
| G05F 1/00 | (2006.01) |
| H03K 3/012 | (2006.01) |
| H03K 3/011 | (2006.01) |
| H03K 3/013 | (2006.01) |
| H02M 3/156 | (2006.01) |
| H02M 1/00 | (2006.01) |

(52) U.S. Cl.
CPC ............ *H03K 3/012* (2013.01); *H02M 3/156* (2013.01); *H03K 3/011* (2013.01); *H03K 3/013* (2013.01); *H02M 2001/0003* (2013.01); *H02M 2001/0025* (2013.01)

(58) Field of Classification Search
CPC ......... H02M 3/156; H02M 2001/0025; H02M 2001/0003; H03K 3/011; H03K 3/012; H03K 3/013

USPC .......................................................... 323/282
See application file for complete search history.

(56) References Cited

U.S. PATENT DOCUMENTS

| | | | | |
|---|---|---|---|---|
| 5,998,945 A * | 12/1999 | Elliott | ................. | H02P 25/0925 318/254.1 |
| 7,529,105 B1 * | 5/2009 | Choi | ................. | H02M 3/33523 363/131 |
| 8,054,056 B2 | 11/2011 | Coleman | | |
| 2008/0067993 A1 * | 3/2008 | Coleman | ................. | H02M 1/08 323/282 |

(Continued)

FOREIGN PATENT DOCUMENTS

| | | |
|---|---|---|
| CN | 101355318 A | 1/2009 |
| CN | 102064696 A | 5/2011 |
| DE | 102004010914 A1 | 9/2005 |

*Primary Examiner* — Alex Torres-Rivera

(57) ABSTRACT

A switched current control module comprises a hysteretic control component arranged to receive high and low threshold values and an indication of a current flow through a load, and to output a switched current control signal based on a comparison of the current flow indication to the high and low threshold values. A threshold generator is arranged to generate the high and low threshold values based on a base threshold value and a hysteretic excursion value. A base threshold value generator is arranged to generate the base threshold value based on the current flow indication and a setpoint value. A hysteretic excursion value generator is arranged to receive an indication of a switching frequency of the switched current control signal output by the hysteretic control component, and to generate the hysteretic excursion value based on the indicated switching frequency of the switched current control signal.

11 Claims, 4 Drawing Sheets

(56) References Cited

U.S. PATENT DOCUMENTS

| | | |
|---|---|---|
| 2009/0051336 A1 | 2/2009 | Hartlieb et al. |
| 2012/0299553 A1 | 11/2012 | Menegoli et al. |
| 2013/0082675 A1* | 4/2013 | Capodivacca .......... G05F 1/468 |
| | | 323/283 |
| 2014/0159598 A1* | 6/2014 | Boezen .............. H05B 33/0848 |
| | | 315/193 |
| 2014/0253181 A1 | 9/2014 | Mukherjee |

* cited by examiner

SWITCHED CURRENT CONTROL MODULE AND METHOD THEREFOR

FIELD OF THE INVENTION

This invention relates to a switched current control module and a method therefor of generating a switched current control signal.

BACKGROUND OF THE INVENTION

In automotive applications such as automatic transmission, closed-loop regulation of average current in inductive loads such as solenoids with an accuracy <2% is required. This challenge is further exacerbated by the requirements of maintaining the accuracy over automotive temperature ranges (−40° C. to 150° C.), supply voltage variations, supply noise, and wide target control range.

FIG. 1 schematically illustrates a simplified example of a conventional hysteretic current control loop 100. A hysteresis generator 110 receives a current measurement signal 120, and outputs either a '1' or '0' switch control signal 130 depending on a comparison of the measured current with high and low threshold values provided by an adder 112, and a subtractor 114.

The high threshold value, provided by the adder 112, is defined by the addition of a setpoint value ($I_{SP}$) 140 and a current excursion value ($\Delta I$) 150. Thus, the high threshold value=($I_{SP}$+$\Delta I$). The low threshold value, provided by the subtractor 114, is defined by the subtraction of the current excursion value ($\Delta I$) 150 from the setpoint value ($I_{SP}$) 140. Thus, the low threshold value=($I_{SP}$−$\Delta I$). The setpoint value (ISP) 140 accordingly provides a 'threshold base value' to which the excursion value ($\Delta I$) 150 is added and subtracted to derive the high and low threshold values respectively.

Such a conventional hysteretic current control loop 100 has a number of advantages over proportional-integral-derivative (PID) controllers, such as a faster transient response, being substantially unaffected by supply voltage variations, and an ability to shape superimposed dither waveforms. However, such a conventional hysteretic current control loop 100 is unable to maintain the average current accuracy over varying conditions (temperature, supply voltage, noise etc.) that is now required for many applications, including automotive applications such as automatic transmission solenoid control.

More specifically, the accuracy of the conventional hysteretic current control loop is, to a large extent, dependent on switching current signal duty cycle and driven load characteristics (e.g inductance, resistance); a medium switching current signal duty cycle close to 50% generally enabling greater average current accuracy than a small or a large switching current signal duty cycle. Moreover, the smaller the current excursion value ($\Delta I$) 150, the higher the switching frequency of the switch control signal 130. If the switching frequency is too high, it can result in low efficiency, larger errors and increased interference. Consequently, such a conventional hysteretic current control loop 100 is typically not capable of achieving the required high accuracy levels (e.g. <2%) whilst at the same time achieving acceptable levels of efficiency, errors and interference caused by high switching frequencies.

SUMMARY OF THE INVENTION

The present invention provides a switched current control module, a semiconductor die comprising such a switched current control module and a method of generating a switched current control signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

In accordance with some example embodiments of the present invention there is provided a switched current control module comprises a hysteretic control component arranged to output a switched current control signal based on a comparison of a current flow indication to high and low threshold values. A threshold generator is arranged to generate the high and low threshold values based on a base threshold value and a hysteretic excursion value.

A base threshold value generator is arranged to generate the base threshold value based on the current flow indication and a setpoint value. This enables the 'strength' with which the hysteretic control component attempts to correct the current flow to be dynamically adjusted in response to the measured current flow, providing a proportional control mechanism within the switched current control module.

A hysteretic excursion value generator is arranged to receive an indication of a switching frequency of the switched current control signal output by the hysteretic control component, and to generate the hysteretic excursion value based on the indicated switching frequency of the switched current control signal. In this manner, the hysteretic excursion step size of the hysteretic control component may be dynamically adjusted depending on the switching frequency of the switched current control signal, thereby enabling the switching frequency of the switched current control signal to be regulated.

Significantly, and as described in greater detail below, by enabling the strength with which the hysteretic control component attempts to correct the current flow to be dynamically adjusted in response to the measured current flow and the switching frequency of the switched current control signal to be regulated, the accuracy of the current control provided by the switched current control module may be significantly increased compared with conventional hysteretic control loops.

Figure 1:
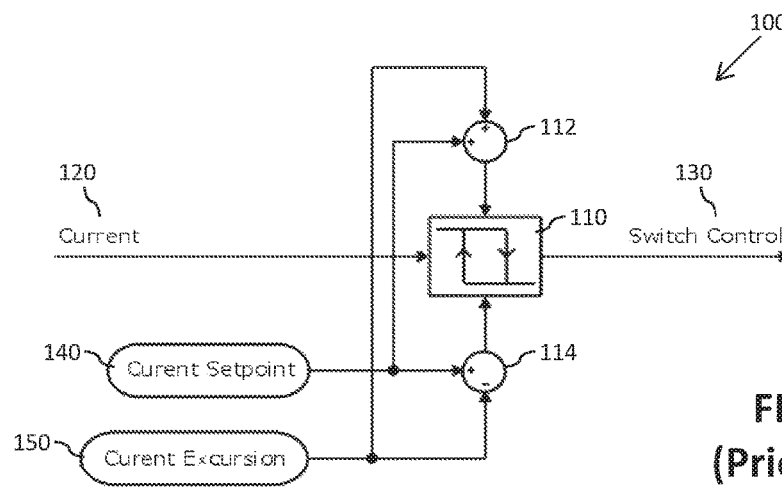
FIG. 1 schematically illustrates a simplified example of a conventional hysteretic current control loop.
Figure 2:
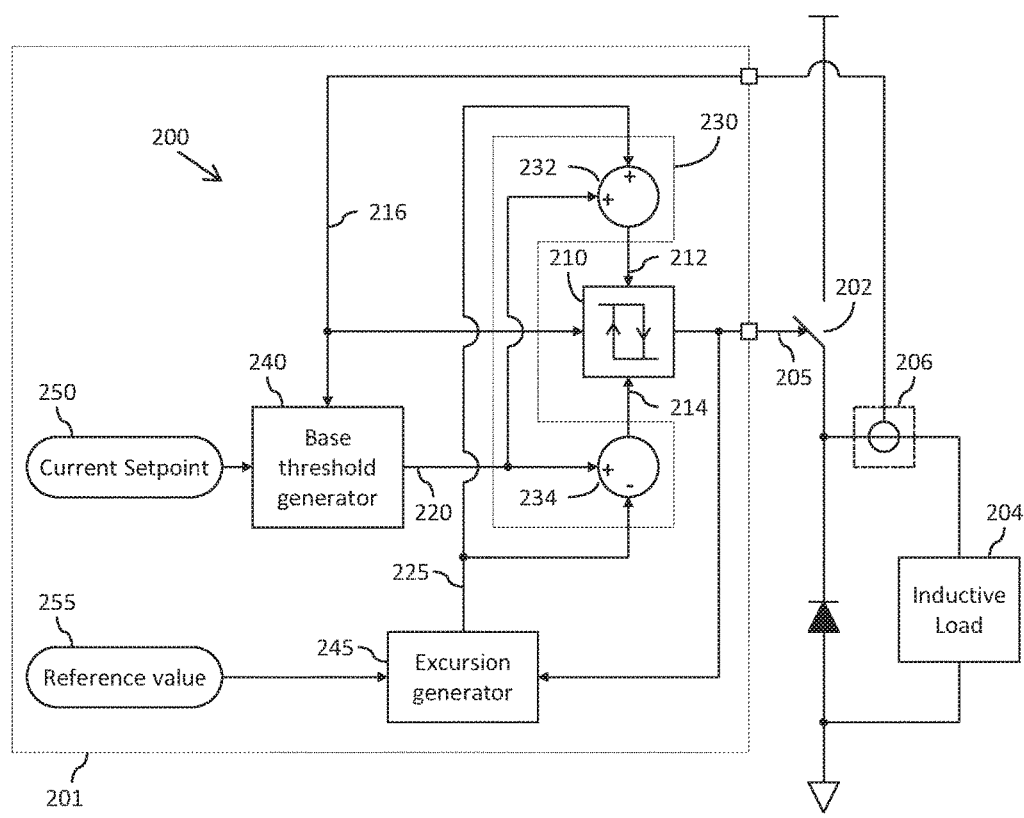
FIG. 2 schematically illustrates a simplified block diagram of an example of a switched current control module.

Referring now to FIG. 2, there is schematically illustrated a simplified block diagram of an example of a switched current control module 200 arranged to output a switched current control signal 205 for controlling a current supply switch 202 for an inductive load 204, such as a solenoid or the like. In the example illustrated in FIG. 2, the switched current control module 200 is implemented within one or more semiconductor dies 201 of an integrated circuit device.

The switched current control module 200 consists of a hysteretic control component 210 arranged to receive a high threshold value signal 212, a low threshold value signal 214 and an indication of a current flow within the inductive load 216, for example provided by a current sense circuit as illustrated generally at 206. The hysteretic control component 210 is arranged to output the switched current control signal 205 based on a comparison of the current flow indication 216 to the high and low threshold value signals 212, 214.

A threshold generator component 230 generates the threshold value signals 212, 214 based on a base threshold value 220 and a hysteretic excursion value 225. In the illustrated example, the threshold generator component 230 consists of an addition component 232 arranged to generate the high threshold value signal 212, and a subtraction component 234 arranged to generate the low threshold value signal 214. The addition component 232 is arranged to receive the base threshold value signal 220 and the hysteretic excursion value signal 225, and to generate the high threshold value signal 212 by summing the base threshold value signal 220 and the hysteretic excursion value signal 225. The subtraction component 234 is arranged to receive the base threshold value signal 220 and the hysteretic excursion value signal 225, and to generate the low threshold value signal 214 by subtracting the hysteretic excursion value signal 225 from the base threshold value signal 220.

A base threshold value generator component 240 is arranged to receive the current flow indication 216 and a setpoint value 250, and to generate the base threshold value signal 220 based on the received current flow indication 216 and setpoint value 250. In particular, the base threshold value generator component 240 is arranged to dynamically adjust the base threshold value signal 220 in response to the received current flow indication 216. In this manner, the base threshold value of the hysteretic control component 210, around which the threshold value signals 212, 214 are set and toward which the hysteretic control component 210 will attempt to drive the measured current flow through the inductive load 204, may be dynamically adjusted depending on the current flow indication 216. This enables the 'strength' with which the hysteretic control component 210 attempts to correct the current flow through the inductive load 204 to be dynamically adjusted in response to the measured current flow, providing a proportional control mechanism within the switched current control module 200.

Figure 3:
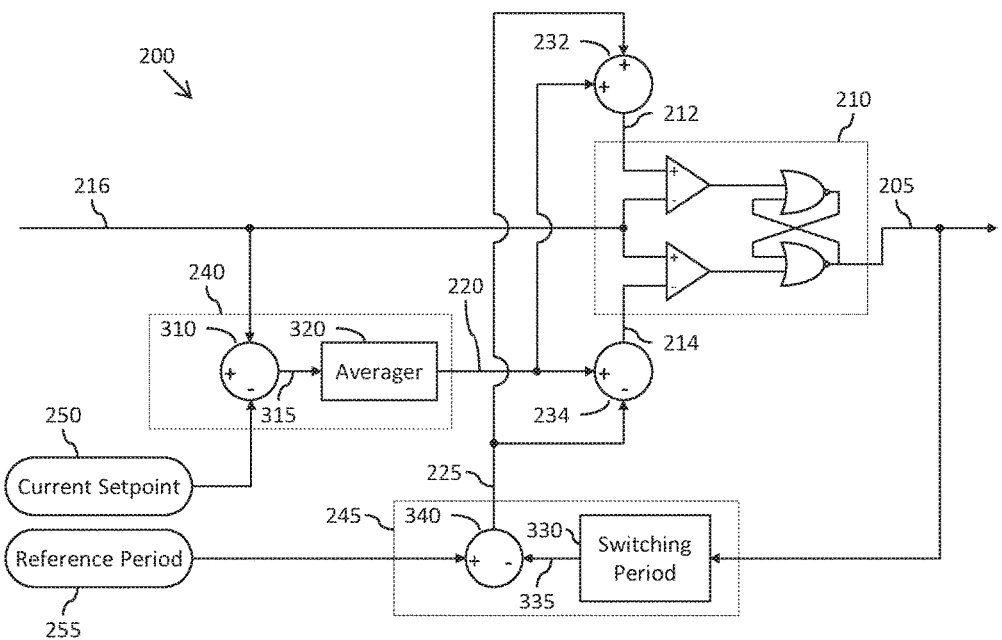
FIG. 3 illustrates a more detailed example of the switched current control module of FIG. 2.
Figure 4:
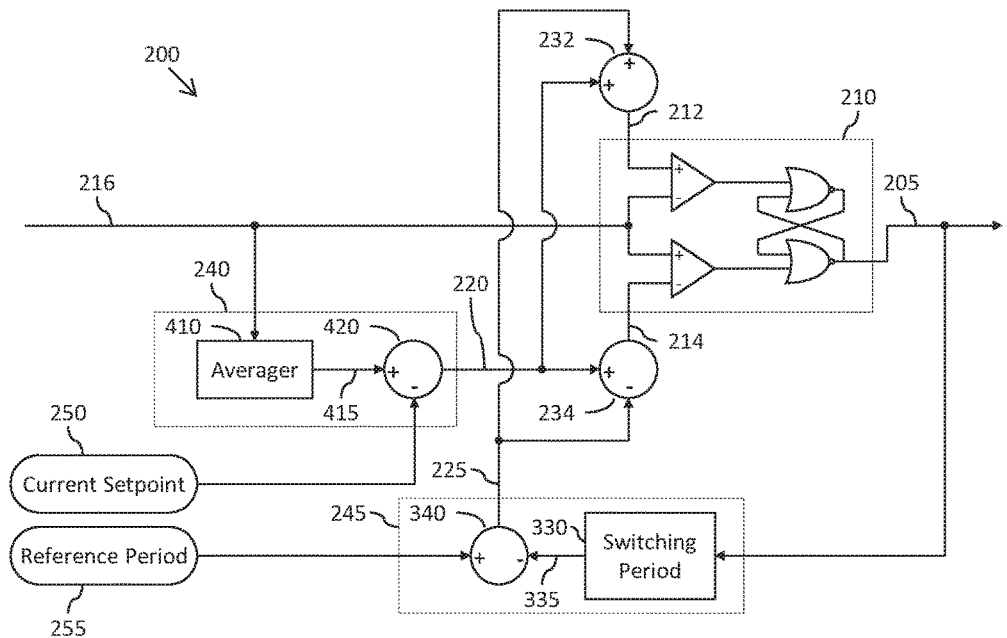
FIG. 4 illustrates an alternative more detailed example of the switched current control module of FIG. 2.

In some example embodiments, the base threshold value generator component 240 is arranged to determine an average current error value for the current flow through the inductive load 204 based on the received current flow indication 216 and setpoint value 250, and generate the base threshold value signal 220 based on the determined average current error value. For example, and as illustrated in FIGS. 3 and 4, the base threshold value generator component 240 may be arranged to generate the base threshold value signal 220 proportional to the determined average current error value. In this manner, the base threshold value signal 220 may be generated to cause the hysteretic control component 210 to control the current flow through the inductive load 204 such that the average current error value is driven to zero, with the average current flow being regulated to a value defined by the setpoint value 250.

A hysteretic excursion value generator component 245 is arranged to receive an indication of a switching frequency of the switched current control signal 205, and to generate the hysteretic excursion value signal 225 based on the indicated switching frequency of the switched current control signal 205. In particular, the hysteretic excursion value generator component 245 is arranged to dynamically adjust the hysteretic excursion value signal 225 in response to variations in the indicated switching frequency of the switched current control signal 205. In this manner, the hysteretic excursion step size of the hysteretic control component 210 may be dynamically adjusted depending on the switching frequency of the switched current control signal 205 output thereby. Accordingly, by adjusting the hysteretic excursion step size, the switching frequency of the switched current control signal 205 may be adjusted, thereby enabling the switching frequency of the switched current control signal 205 to be regulated.

In some example embodiments, the hysteretic excursion value generator component 245 is arranged to derive a switching frequency value based on the indicated switching frequency of the switched current control signal 205, and to generate the hysteretic excursion value signal 225 based on the derived switching frequency value and a reference value 255. For example, and as illustrated in FIGS. 3 and 4, the hysteretic excursion value generator component 245 may be arranged to derive a switching frequency value inversely proportional to the indicated switching frequency of the switched current control signal 205 (i.e. proportional to the switching period of the switched current control signal 205). The hysteretic excursion value generator component 245 may then subtract the switching frequency value from the reference value 255 to generate the hysteretic excursion value signal 225. In this manner, the hysteretic excursion value signal 225 may be dynamically generated to regulate the switching frequency of the switched current control signal 205 to a switching frequency defined by the reference value 255.

Referring now to FIG. 3, there is illustrated a more detailed example of the switched current control module 200 of FIG. 2. In the example illustrated in FIG. 3, the hysteretic control component 210 is implemented by way of high and low threshold comparators, and an S-R latch formed from pair of NOR elements.

The base threshold value generator component 240 in the example illustrated in FIG. 3 consists of a subtraction component 310 arranged to receive the current flow indication 216 and the setpoint value 250, and to output a current error value 315 derived from subtracting the current flow indication 216 from the setpoint value 250. The base threshold value generator component 240 further consists of an averager component 320 arranged to receive the current error value 315 output by the subtraction component 310, and to output as the base threshold value signal 220 an average current error value derived from the received current error value 315.

The hysteretic excursion value generator component 245 in the example illustrated in FIG. 3 consists of a switching period component 330 arranged to receive the switched current control signal 205, determine a switching period for the switched current control signal 205, and to output a switching frequency value 335 representative of the determined switching period of the switched current control signal 205. The hysteretic excursion value generator component 245 in the example illustrated in FIG. 3 further consists of a subtraction component 340 arranged to receive the reference value 255 and the switching frequency value 335 output by the switching period component 330, and to output the hysteretic excursion value signal 225 derived from subtracting the switching frequency value 335 from the reference value 255.

Referring now to FIG. 4, there is illustrated an alternative more detailed example of the switched current control module 200 of FIG. 2. In the example illustrated in FIG. 4, the hysteretic control component 210 is again implemented by way of high and low threshold comparators, and an S-R latch formed from pair of NOR elements.

The base threshold value generator component 240 in the example illustrated in FIG. 4 consists of an averager component 410 arranged to receive the current flow indication 216, and to output an average current value 415 derived from the received current flow indication 216. The base threshold value generator component 240 further consists of a subtraction component 420 arranged to receive the average current value 415 output by the averager component 410 and the setpoint value 250, and to output as the base threshold value signal 220 an average current error value derived from the received average current value 415 and the setpoint value 250.

The hysteretic excursion value generator component 245 in the example illustrated in FIG. 4 also consists of a switching period component 330 arranged to receive the switched current control signal 205, determine a switching period for the switched current control signal 205, and to output a switching frequency value 335 representative of the determined switching period of the switched current control signal 205. The hysteretic excursion value generator component 245 in the example illustrated in FIG. 4 further consists of a subtraction component 340 arranged to receive the reference value 255 and the switching frequency value 335 output by the switching period component 330, and to output the hysteretic excursion value signal 225 derived from subtracting the switching frequency value 335 from the reference value 255.

Performance evaluation of example implementations of the present invention (FFH—Fixed Frequency Hysteretic) compared with conventional hysteretic current control loops (Basic Hyst) and conventional proportional-integral-derivative controllers (PID) have demonstrated at least the following improvements provided by the present invention over such prior art controllers:

1. Maximum average current remaining error (steady-state):
    PID: <0.2% but goes above 6% in case of supply voltage disturbance
    Basic Hyst: <0.6%
    FFH: <0.5%
2. Achievable rising time at 95% of the final value without significant frequency ripples or overshoot:
    PID: 59.9 ms
    Basic Hyst: 1.9 ms
    1.9 ms
3. Switching frequency behaviour for multiple current setpoints (1A=>0.5A=>1.5A):
    PID: by construction the PWM frequency is fixed (2 kHz)
    Basic Hyst: no control of switching frequency
    FFH: regulated frequency at Ftarget=2 kHz
4. Power supply voltage disturbance:
    A supply voltage drop (4V step) has no effect on the average current for Basic Hyst and FFH control loops. However, it has a large impact on the average current and transient response for the PID loop, which can leads to instability due to the slow behavior of the regulation.
    5% Vbat; 10% Ftarget superimposed sin-wave disturbance has no effect on the average current for Basic Hyst and FFH loops. However, it induces permanent oscillations within the PID loop, whose impact can be slightly reduced if the sin-wave characteristics are known.
5. Dither Induced delay in steady-state:
    PID: 1.6 ms (as such unable to shape the dither waveform correctly)
    Basic Hyst: 0.3 ms
    FFH: 0.2 ms From the above performance evaluations, it can be seen that example implementations of the present invention provide significant improvements over conventional hysteretic and PID control loop implementations.

Figure 5:
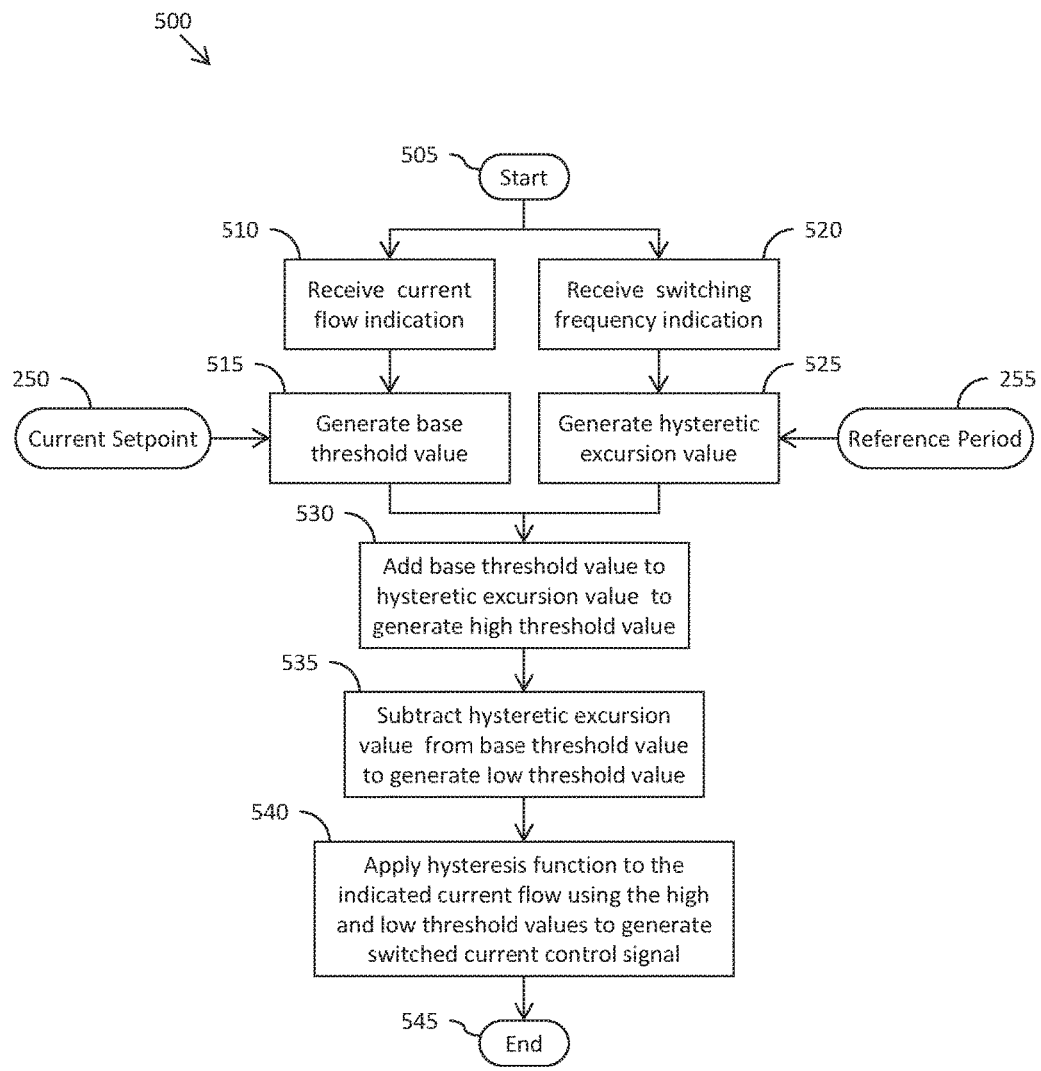
FIG. 5 illustrates a simplified flowchart of an example of a method of generating a switched current control signal.

Referring now to FIG. 5, there is illustrated a simplified flowchart 500 of an example of a method of generating a switched current control signal. The method starts at 505. An indication of a current flow through a load is received at 510, and a base threshold value is generated at 515 based on the received current flow indication and a setpoint value 250. For example, an average current error for the current flow through the load may be determined based on the received indication of current flow through the load and the setpoint value 250, and the base threshold value generated based on the determined average current error value. For example, the base threshold value may be generated to be proportional to the determined average current error value.

An indication of a switching frequency of the switched current control signal is received at 520, and a hysteretic excursion value is generated at 525 based on the indicated switching frequency of the switched current control signal. In the example illustrated in FIG. 5, the hysteretic excursion value is generated at 525 based on the indicated switching frequency of the switched current control signal and a reference value 255. For example, the method may comprise deriving a switching frequency value inversely proportional to the indicated switching frequency of the switched current control signal and subtracting the switching frequency value from the reference value to generate the hysteretic excursion value signal.

A high threshold value is generated based on the base threshold value and the hysteretic excursion value at 530. In the illustrated example, the high threshold value is generated by summing the base threshold value generated at 515 and the hysteretic excursion value generated at 525.

A low threshold value is generated based on the base threshold value and the hysteretic excursion value at 535. In the illustrated example, the low threshold value is generated by subtracting the hysteretic excursion value generated at 525 from the base threshold value generated at 515.

A hysteresis function is then applied to the indicated current flow using the high and low threshold values to generate the switched current control signal, at 540, and the method ends at 545.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

For example, the invention has been hereinbefore described with reference to being implemented within a semiconductor die, for example by way of appropriate circuitry and hardware components. However, it is contemplated that some example embodiments of the invention may equally be implemented within software, for example executing on one or more signal processing devices within an integrated circuit device such as an Application Specific Standard Product (ASSP) or the like. Accordingly, the invention may also be implemented in computer program code for running on a computer system, at least including code portions for performing steps of the method illustrated in FIG. 5 according to the invention when run on a programmable apparatus, such as a computer system or enabling a programmable apparatus to perform functions of a device or system according to the invention.

Figure 6:
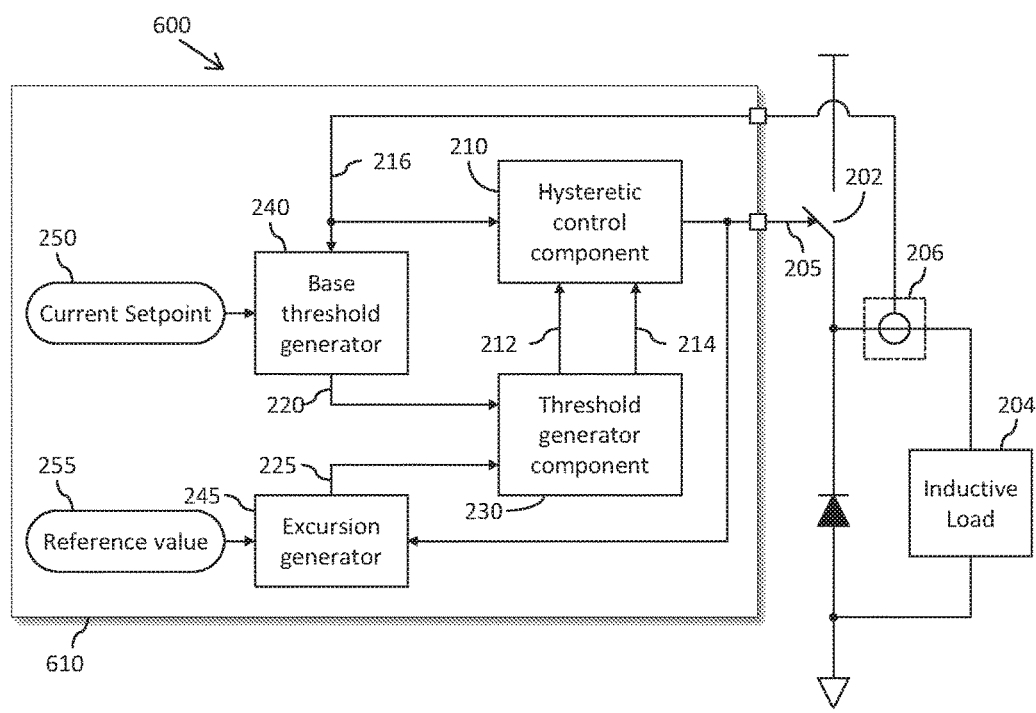
FIG. 6 illustrates a simplified block diagram of an alternative example of a switched current control module.

FIG. 6 illustrates a simplified block diagram of an alternative example of a switched current control module 600 arranged to output a switched current control signal 205 for controlling a current supply switch 202 for an inductive load 204, such as a solenoid or the like. In the example illustrated in FIG. 6, the switched current control module 600 is implemented in computer program code executing on one or more processing cores 610. The switched current control module 600 consists of a hysteretic control component 210 arranged to receive a high threshold value signal 212, a low threshold value signal 214 and an indication of a current flow within the inductive load 216, for example provided by a current sense circuit as illustrated generally at 206. The hysteretic control component 210 is arranged to output the switched current control signal 205 based on a comparison of the current flow indication 216 to the high and low threshold value signals 212, 214.

A threshold generator component 230 generates the threshold value signals 212, 214 based on a base threshold value 220 and a hysteretic excursion value 225.

A base threshold value generator component 240 is arranged to receive the current flow indication 216 and a setpoint value 250, and to generate the base threshold value signal 220 based on the received current flow indication 216 and setpoint value 250. In some example embodiments, the base threshold value generator component 240 is arranged to determine an average current error value for the current flow through the inductive load 204 based on the received current flow indication 216 and setpoint value 250, and generate the base threshold value signal 220 based on the determined average current error value.

A hysteretic excursion value generator component 245 is arranged to receive an indication of a switching frequency of the switched current control signal 205, and to generate the hysteretic excursion value signal 225 based on the indicated switching frequency of the switched current control signal 205. In some example embodiments, the hysteretic excursion value generator component 245 is arranged to derive a switching frequency value based on the indicated switching frequency of the switched current control signal 205, and to generate the hysteretic excursion value signal 225 based on the derived switching frequency value and a reference value 255. For example, the hysteretic excursion value generator component 245 may be arranged to derive a switching frequency value inversely proportional to the indicated switching frequency of the switched current control signal 205 (i.e. proportional to the switching period of the switched current control signal 205). The hysteretic excursion value generator component 245 may then subtract the switching frequency value from the reference value 255 to generate the hysteretic excursion value signal 225.

Significantly, for the example illustrated in FIG. 6, one or more of the hysteretic control component 210, threshold generator component 230, base threshold generator component 240 and excursion generator component 245 are implemented by way of computer program code. Computer program code is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on a tangible and non-transitory computer readable storage medium or transmitted to the computer system via a computer readable transmission medium. All or some of the computer program may be provided on computer readable media permanently, removably or remotely coupled to an information processing system. The tangible and non-transitory computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single semiconductor die or within a same device. Alternatively, the examples may be implemented as any number of separate semiconductor dies or separate devices interconnected with each other in a suitable manner.

Also for example, the examples, or portions thereof, may be implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A switched current control module comprising:
a hysteretic control component arranged to receive a high threshold value signal, a low threshold value signal and an indication of a current flow through a load, and to output a switched current control signal based on a comparison of the current flow indication to the high and low threshold value signals;
a threshold generator component arranged to generate the high and low threshold value signals based on a base threshold value and a hysteretic excursion value;
a base threshold value generator component arranged to receive the current flow indication and a setpoint value, to determine an average current error value for the current flow through the load based on the received indication of current flow through the load and the setpoint value, and to generate the base threshold value signal based on the determined average current error value; and
a hysteretic excursion value generator component arranged to receive an indication of a switching frequency of the switched current control signal output by the hysteretic control component, and to generate the hysteretic excursion value signal based on the indicated switching frequency of the switched current control signal.

2. The switched current control module of claim 1, wherein the base threshold value generator component is arranged to generate the base threshold value signal proportional to the determined average current error value.

3. The switched current control module of claim 1, wherein the hysteretic excursion value generator component is arranged to derive a switching frequency value based on the indicated switching frequency of the switched current control signal, and to generate the hysteretic excursion value signal based on the derived switching frequency value and a reference value.

4. The switched current control module of claim 3, wherein the hysteretic excursion value generator component is arranged to derive the switching frequency value inversely proportional to the indicated switching frequency of the switched current control signal and to subtract the switching frequency value from the reference value to generate the hysteretic excursion value signal.

5. The switched current control module of claim 1, wherein the threshold generator component comprises:
an addition component arranged to receive the base threshold value signal and the hysteretic excursion value signal, and to generate the high threshold value signal by summing the base threshold value signal and the hysteretic excursion value signal; and
a subtraction component arranged to receive the base threshold value signal and the hysteretic excursion value signal, and to generate the low threshold value signal by subtracting the hysteretic excursion value signal from the base threshold value signal.

6. A semiconductor die comprising the switched current control module according to claim 1.

7. A method of generating a switched current control signal; the method comprising:
receiving an indication of a current flow through a load;
determining an average current error for the current flow through the load based on the received indication of current flow through the load and a setpoint value;
generating a base threshold value based on the determined average current error value;
receiving an indication of a switching frequency of the switched current control signal;
generating a hysteretic excursion value based on the indicated switching frequency of the switched current control signal;
generating a high threshold value and a low threshold value based on the base threshold value and the hysteretic excursion value; and
applying a hysteresis function to the indicated current flow using the high and low threshold values to generate the switched current control signal.

8. The method of claim 7, wherein the method comprises generating the base threshold value signal proportional to the determined average current error value.

9. The method of claim 7, wherein the method comprises deriving a switching frequency value based on the indicated switching frequency of the switched current control signal, and generating the hysteretic excursion value signal based on the derived switching frequency value and a reference value.

10. The method of claim 9, wherein the method comprises deriving the switching frequency value inversely proportional to the indicated switching frequency of the switched current control signal and subtracting the switching frequency value from the reference value to generate the hysteretic excursion value signal.

11. The method of claim 7, wherein the method comprises:
generating the high threshold value by summing the base threshold value and the hysteretic excursion value; and
generating the low threshold value by subtracting the hysteretic excursion value from the base threshold value.

* * * * *